May 4, 1971 M. W. LESNIESKI 3,577,239

METHOD OF PHOTOGRAPHICALLY PRODUCING PLATED-THROUGH HOLES IN PRINTED CIRCUIT BOARDS

Filed Dec. 16, 1968 2 Sheets-Sheet 1

INVENTOR
MATTHEW W. LESNIESKI
BY Harold P. Pallon
ATTORNEY

INVENTOR
MATTHEW W. LESNIESKI
BY [signature]
ATTORNEY

United States Patent Office 3,577,239

Patented May 4, 1971

3,577,239

METHOD OF PHOTOGRAPHICALLY PRODUCING PLATED-THROUGH HOLES IN PRINTED CIRCUIT BOARDS

Matthew W. Lesnieski, Bloomingdale, N.J., assignor to Monsanto Company, St. Louis, Mo.

Filed Dec. 16, 1968, Ser. No. 783,924

Int. Cl. G03c 5/00

U.S. Cl. 96—36.2 4 Claims

ABSTRACT OF THE DISCLOSURE

Production of plated-through holes in printed circuit cards by drilling holes at predetermined locations in a base material, plating the interior hole surfaces with a thin layer of conductive metal, coating with a layer of photo-resist, vacuum-drawing portions of a flexible metal foil into the holes, and exposing the photo-resist and foil to light, whereby the photo-resist covering the interior surfaces of the holes is properly exposed.

FIELD OF THE INVENTION

The present invention relates generally to a method or process for producing plated holes in a base material, and more particularly, to a method of producing plated-through holes in printed circuit boards, or the like.

BACKGROUND OF THE INVENTION AND DESCRIPTION OF THE PRIOR ART

In the field dealing with the production of printed circuit cards for mass produced electronic apparatus, it has become accepted pratice to provide circuit components and attendant conductive metal interconnects or "runs" on both sides of a printed circuit card. A typical printed circuit card consists of an insulating base material having copper interconnects extending along its sides between holes used to receive and support leads or terminals of discrete components or integrated circuit devices, which leads are soldered to the copper interconnects.

Oftentimes it is desirable to provide holes through the printed circuit board for the purpose of interconnecting the leads of components or devices and the interconnects on one side of the board to those conducting paths on the other side. Thus, it is desirable in mass producing the printed circuit cards to provide copper plated-through holes; that is, holes having a thin layer of copper deposited along their wall surfaces providing an electrically conductive path between interconnects provided on each side of the card.

Heretofore, it has been difficult to produce plated-through holes free of defects for the reason that photo-resist used to cover the interior surfaces during the printed circuit card production processes cannot be adequately exposed to light, especially where the holes are extremely small in diameter. Unless the photo-resist is properly exposed, undesirable etching may occur at the copper-plated surfaces of the holes, thereby interrupting the interconnecting circuit between one side of the board and the other.

SUMMARY OF THE INVENTION

The general purpose of this invention is to provide a method of producing plated-through holes in printed circuit cards, which method embraces all of the advantages of similarly employed methods, yet does not possess the aforedescribed disadvantages of inadequately exposed plated-through holes. To attain this, the present invention utilizes a unique method of forming light reflecting surfaces within the printed circuit card holes during the time light is directed into the holes for exposing the photo-resist.

An object of the present invention is the provision of a method for producing plated-through holes in printed circuit boards.

Another object of the present invention is the provision of the method for producing plated-through holes in printed circuit cards, wherein defects are substantially reduced and overall yield substantially increased.

In the present invention these purposes (as well as others apparent herein) are achieved generally by drilling holes at predetermined locations in a copper-clad base material or printed circuit board. The walls of the drilled holes are then plated within a thin layer of copper, which is in turn coated with a suitable photo-resist. A flexible reflective metal foil is then positioned adjacent to one side of the board, thereby covering one end of the drilled holes. A vacuum is applied to the holes at their opposite ends, causing portions of the metal foil to draw inwardly a sufficient distance to form a light-scattering surface with the hole. Light is then directed onto the light-scattering surfaces and diffused onto the photo-resist covering the walls of the holes. Subsequent development of the photo-resist, etching of the board, and finally removal of the developed photo-resist results in a completed circuit board having plated-through holes which are substantially free of defects.

BRIEF DESCRIPTTION OF THE DRAWINGS

Utilization of the method of the present invention will become apparent to those skilled in the art from the disclosures made in the following description, as illustrated in the accompanying drawings, in which.

DESCRIPTION OF THE PREFERRED METHOD OF THE INVENTION

Figure 1:
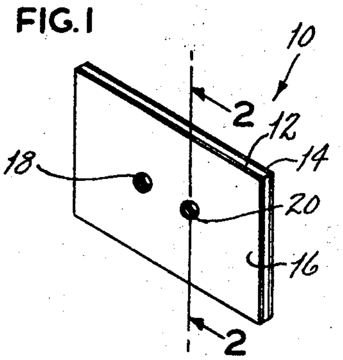
FIG. 1 is a perspective view of a circuit board having copper-plated sides and holes drilled therethrough.

Referring now to the drawings, wherein like reference characters designate like or corresponding parts throughout the several views, there is shown in FIG. 1 a commercially available copper-clad board, generally designated 10, used in making printed circuit cards. The board 10 consists of an insulating material (for example, a combination glass and epoxy composition) sandwiched between thin copper layers 14 and 16 which are plated to and completely cover the sides of the insulating material 12. Although specific reference has been made to a glass-epoxy insulating material 12, it should be understood that other suitable compositions may be used, provided that it is a suitable insulator, and further provided that the copper layers will properly adhere thereto.

Figures 2A, 2B, 2C:
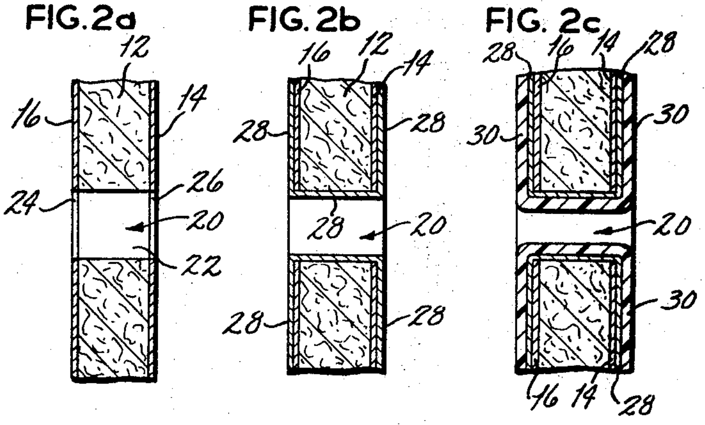
FIGS. 2A–2C are enlarged, cross-sectional views illustrating the initial copper plating and photo-resist preparatio of printed circuit cards in accordance with the method of the present invention.
Figure 7:
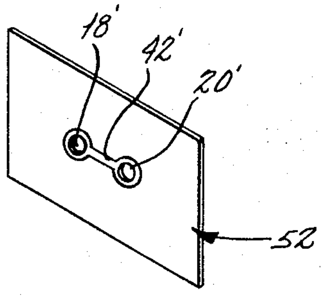
FIG. 7 is a perspective view of a completed circuit card having plated-through holes produced in accordance with the methods of the present invention.

In practicing the method of the present invention, it is determined where plated-through holes are desired in a final circuit (see FIG. 7). Then holes are drilled through the stock material 10 at these particular locations, as indicated at 8 and 20 in FIG. 1. For purposes of clearly illustrating the invention only two such drilled holes 18 and 20 are shown drilled in the board 10; it being understood that in actual practice many such holes may be drilled in the stock material to correspond to the desired plated-through holes of the final circuit board. FIG. 2A illustrates in cross-sectional detail the hole 20 after drilling.

The hole-defining surface 22 consists of insulating material and copper ring portions 24 and 26. It should be apparent that in order to provide electrical continuity between the two sides of the board 10, it is necessary to coat the surface 22 with a conductive material, such as copper, to make it continuous with the copper ring portions 24 and 26. This is normally accomplished by plating the entire board 10 with a thin layer (approximately .001 inch thick) of copper, as indicated at 28 in FIG. 2B. This provides a copper layer along the inner surface or wall of the hole 20, thereby to bridge across from one copper layer 14 to the other 16. The plating or deposition of the copper layer 28 may be carried out by any of the well known processes of copper deposition for printed circuit cards. Such copper deposition is well known, and therefore will not be described in detail.

After the copper layer 28 has been deposited on the base material 10, it is coated with a photo-resist, by immersion in a photo-resist tank, by pouring the photo-resist over the entire surface of the base material, or in any other well known manner. Care is taken to insure that the photo-resist completely covers the inner surfaces or walls of the holes 18 and 20, and that all bubbles are removed from the photo-resist layer 30. The photo-resist may be any light-sensitive resist, for example, the resist commercially available under the trade name Dynachem Type 3140 available from the Dynachem Corporation, Downey, Calif.

After the photo-resist layer 30 has been deposited, it is allowed to air dry for approximately two minutes until it becomes tacky. It is then baked in an oven at a temperature of about 125° F. for approximately 30 minutes. This allows the photo-resist to harden and readies it for subsequent light exposure.

Figure 3:
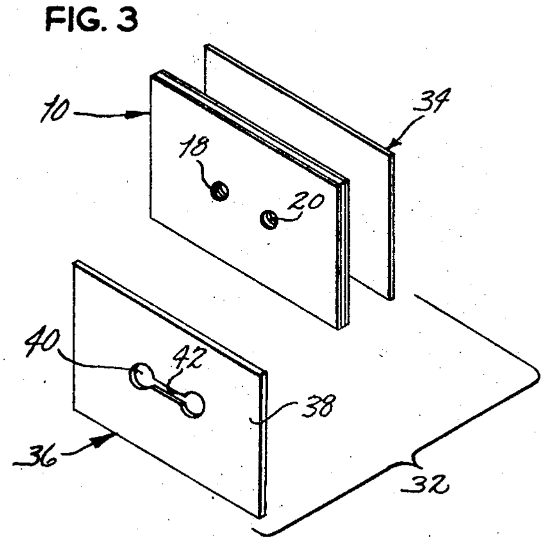
FIG. 3 is an exploded view illustrating the printed circuit card of FIG. 2C being prepared for light exposure in accordance with the method of the present invention.

The board assembly shown in FIG. 2C is then removed from the oven and positioned in the sandwich structure 32, shown in FIG. 3. The sandwich structure 32 consists of the copper-clad, epoxy-base board 10 now covered with photo-resist, a sheet of reflective metal foil (such as aluminum foil) 34, and a mask 36. As is well known, the mask 36 takes the form of a photographic negative of the desired final printed circuit board configuration. It may be produced photographically or by cutting out strips from a suitably coated film. The methods for producing the mask 36 are well known to those skilled in the printed circuit art and therefore will not be described in detail. However, it should be noted that the mask 36 consists generally of an opaque portion 38 and a transparent or other light-transmitting portion 40.

In the simplified printed circuit card configuration shown in FIG. 7, there are two plated-through holes 18′ and 20′ connected by means of a copper strip or runner 42. Therefore, the mask 36 is prepared so as to provide a light-transmitting portion 40 having two enlarged circular portions at each end, the enlarged portions being connected by means of a narrow strip 42.

The sandwich structure 32 of FIG. 3 is inserted in a commercially available vacuum frame, generally designated 44, including a transparent face plate 46 and a flexible membrane or diaphragm 48. A typical vacuum frame suitable for use in practicing this invention is available from Cincinnati Printing and Drying Systems, Inc., Cincinnati, Ohio, and is designated by the model number CIN–2. The vacuum frame flexible membrane 48 of the vacuum frame 44 may take the form of a large latex sheet. The vacuum frame is sealed and has an inlet (not shown) connectable to a vacuum pump, so that a vacuum may be drawn within the chamber formed between the transparent face plate 46 and the flexible membrane 48.

Figure 4A:
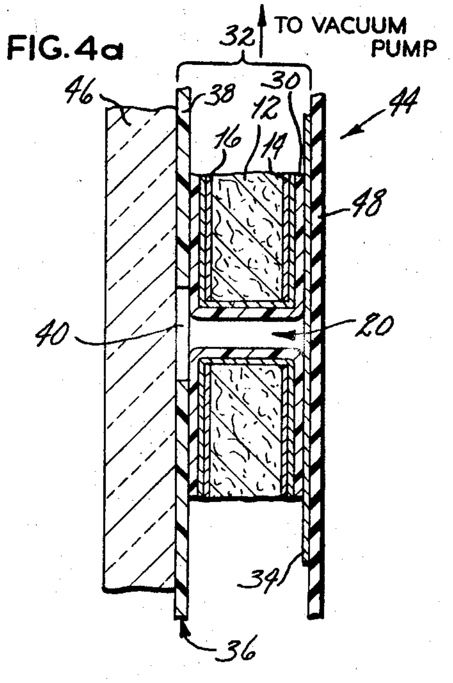
FIGS. 4A and 4B are enlarged cross-sectional views of the printed circuit card assembly of FIG. 3 positioned in a vacuum frame for exposure to light.
Figure 4B:
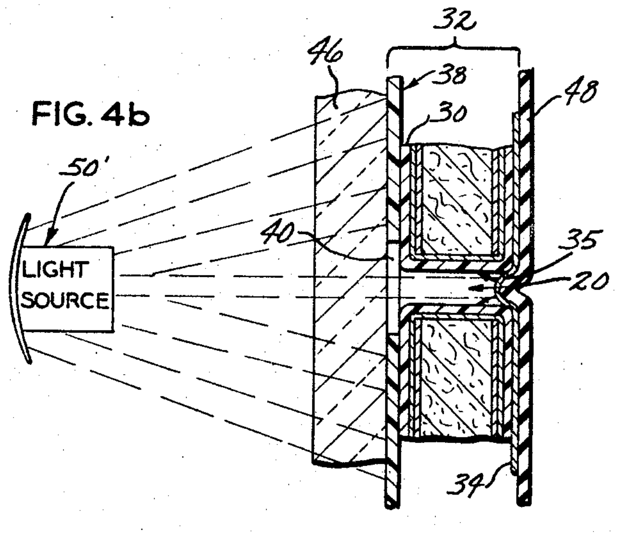

The vacuum chamber of the vacuum frame is pumped down by means of a vacuum pump (not shown). This causes the membrane 48 to force the flexible foil 34 into the holes 18 and 20 as shown in FIG. 4B. The portions 35 of the metal foil 34 which protrude into the hole 20 are curved and generally lens-shaped.

After the lens-like curved foil surfaces have been formed within the holes 18 and 20, the sandwich structure 32 is exposed by means of a light source, generally designated 50. The light source may take the form of a General Electric Co. NV8000p, 8000 watt xenon flash lamp (commercially available from the nuArc Co., Inc., Chicago, Ill.) spaced three or four feet from the vacuum frame 44. It may be pulsed periodically for a period of about 10 minutes for each side exposure of the board 10. Light passes through the light-transmitting portion 40 of the mask 38 and exposes the photo-resist defined by the openings in the mask. In addition, the light is directed through the holes 18 and 20 onto the reflecting surfaces of the lens-like portions 35 of the metal foil 34. These lens portions 35 diffuse the light to the photo-resist covered interior surfaces of the holes 18 and 20. In this manner the photo-resist covering the interior surfaces of the holes 18 and 20 is completely exposed to the light from the pulse light source 50. Light falling upon the opaque portions 38 of the mask 36 is not passed, and therefore has no effect upon those portions of the photo-resist masked thereby.

After the sandwich structure 32 has been exposed on its one side as shown in FIG. 4*b*, it is repositioned in the vacuum frame with its other side directed toward the light source 50 and the light exposed side adjacent to the flexible foil 34. In actual practice, the interconnects to be formed on the other side are not always identical, and therefore a new photographic mask is substituted for mask 38 between the glass plate 46 and the sandwich structure 32. It should be apparent from FIG. 7 that the photographic mask for exposing the other side of the board will be provided with light-transmitting portions corresponding to and registered with the holes 18 and 20. The light exposure procedure for the photo-resist on the other side of the printed circuit board is identical to that described hereinabove; the vacuum is applied to draw the foil 34 inwardly into the holes 18 and 20 and the light source pulsed to expose the photo-resist through the new mask.

Figure 5:
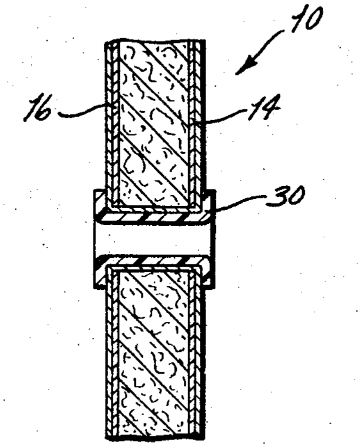
FIG. 5 is a cross-sectional view of the printed circuit card assembly of FIG. 2C after selective removal of developed photo-resist.
Figure 6:
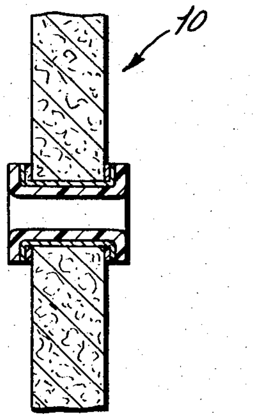
FIG. 6 is an enlarged cross-sectional view of the printed card assembly of FIG. 5 after selective etching of a portion of its copper plating.

After both sides of the printed circuit board 10 have been exposed, it is removed from the vacuum frame and the exposed photo-resist 30 developed by immersing the board in an appropriate development solution, such as Dynachem Developer for type 3140 photo-resist. The board is then removed, thereby removing the unexposed photo-resist as shown in FIG. 5. After the unexposed photo-resist has been removed, the printed circuit board 10 is returned to the oven and baked for approximately 15 minutes at approximately 315° F. to post-bake the remaining photo-resist 30. The printed circuit card 10 is then immersed in a copper etchant bath consisting of a standard copper etching solution such as McDermid type MU etchant available from McDermid, Inc., Waterbury, Conn. This results in the copper clad portions 14 and 16 of the board (which were not covered by the remaining photo-resist 30) being etched away, as shown in FIG. 6.

The printed circuit board 10 is then placed in a solution of photo-resist stripper, such as that sold by Dynachem Corp., which solution removes the remaining photo-resist 32, but which does not react with the copper portions covered thereby. This results in the final printed circuit card as shown in FIG. 7. It consists of an unclad portion 52 and copper-clad portions consisting of the run 42 and the plated-through holes 18′ and 20′.

In summary, it may be seen that the above-described process results in a printed circuit card having plated-through holes which are free from defects normally resulting from improper exposure of photo-resist used to coat small diameter holes. It has been found that the use of the lens-like reflecting surfaces of the metal foil 34 during the light exposure step of the process results in fewer defective plated-through holes, and therefor higher overall yields.

Many modifications and variations of the present invention are possible in view of the above teachings. For example, instead of using a base material having copper-clad sides, it is possible to plate the sides of the base material as a part of the plating of the inner surface of the plated-through holes. Furthermore, laminated multi-layer printed circuit boards may be provided with plated through holes in accordance with the method taught hereinabove. Therefore, it is to be understood, that the invention may be practiced otherwise than as specifically described.

I claim:

1. A method for making plated-through holes in printed circuit cards, comprising the steps of forming holes at predetermined locations through a base material, plating the base material including the surfaces defining said holes with a conductive metal to form a metal-clad board, coating said metal-plated, hole-defining surfaces and said metal-plated base material with a photo-resist, placing the metal-clad, photo-resist covered board in a vacuum frame, positioning a flexible sheet of reflecting material adjacent to one side of said board, and applying a vacuum to said holes from the other side of said board, said vacuum being sufficient to cause portions of said flexible sheet to draw inwardly and protrude within said holes, thereby to form a light-scattering lens within said hole, directing light onto portions of said photo-resist coated, metal-clad board and onto said light-scattering lens, removing the unexposed photo-resist and conductive-metal portions of the board covered thereby, and removing the exposed photo-resist, thereby to leave the conductive-metal portions covered thereby.

2. The method as defined in claim 1, wherein said flexible sheet is a reflective metal foil.

3. A method for making plated-through holes in printed circuit cards, comprising the steps of drilling holes at predetermined locations in a base material, plating the base material including the surfaces defining said holes with a layer of copper to form a copper-clad board, coating said copper-plated, hole-defining surfaces and said copper-plated base material with a photo-resist, fixing a flexible, reflective metal foil adjacent to one side of said board, and applying a vacuum to said holes from the other side of said board, said vacuum being sufficient to cause portions of said flexible metal foil to draw inwardly within said holes, thereby to form a light-scattering lens within said holes, exposing said other side of said board and said light-scattering lenses through a mask, repositioning the board with said other side adjacent said flexible foil, exposing said one side of said board through a mask, removing the unexposed photo-resist and conductive-copper-plated portions of the board covered thereby, and removing the exposed photo-resist, thereby to leave the conductive-metal portions covered thereby.

4. A method for developing photo-resist covering surfaces which define holes in a base material, comprising the steps of fixing a sheet of reflective metal foil adjacent one side of said base material, applying a vacuum to said holes at the other side of said base material, said vacuum being sufficient to cause portions of said reflective metal foil to draw inwardly and protrude within said holes, thereby to form a light-scattering lens therein, directing light through said holes onto said light-scattering lens, whereby light is directed from said light-scattering lens onto the photo-resist covered surfaces of said holes.

References Cited

UNITED STATES PATENTS

| | | | |
|---|---|---|---|
| 1,658,509 | 2/1928 | Beeke | 96—37X |
| 3,269,861 | 8/1966 | Schneble et al. | 96—362UX |

DAVID KLEIN, Primary Examiner

U.S. Cl. X.R.

96—37